United States Patent [19]
Takemura

[11] Patent Number: 5,508,533
[45] Date of Patent: Apr. 16, 1996

[54] SEMICONDUCTOR DEVICE AND METHOD OF FABRICATING SAME

[75] Inventor: Yasuhiko Takemura, Kanagawa, Japan

[73] Assignee: Semiconductor Energy Laboratory Co., Ltd., Kanagawa, Japan

[21] Appl. No.: 286,455

[22] Filed: Aug. 5, 1994

[30] Foreign Application Priority Data

Aug. 12, 1993 [JP] Japan .................................. 5-220592

[51] Int. Cl.$^6$ ..................... H01L 29/04; H01L 31/036; H01L 29/12; H01L 29/76
[52] U.S. Cl. ................... 257/64; 257/65; 257/66
[58] Field of Search ................. 257/64, 65, 74, 257/75, 66

[56] References Cited

U.S. PATENT DOCUMENTS

| | | |
|---|---|---|
| 4,746,628 | 5/1988 | Takafuji et al. . |
| 5,147,826 | 9/1992 | Liu et al. . |
| 5,231,297 | 7/1993 | Nakayama et al. ........................ 257/65 |
| 5,275,851 | 1/1994 | Fonash et al. . |

FOREIGN PATENT DOCUMENTS

| 54-3353 | 2/1979 | Japan ........................................ 257/64 |
|---|---|---|

OTHER PUBLICATIONS

C. Hayzelden et al., "In Situ Transmissiion Electron Microscopy Studies of Silicide–Mediated Crystallization of Amorphous Silicon" (3 pages).

A. V. Dvurechenskii et al., "Transport Phenomena in Amorphous Silicon Doped by Ion Implantation of 3d Metals", *Akademikian Lavrentev Prospekt* 13, 630090 Novosibirsk 90, USSR, pp. 635–640.

T. Hempel et al., "Needle–Like Crystallization of Ni Doped Amorphous Silicon Thin Films", *Solid State Communications*, vol. 85, No. 11, pp. 921–924, 1993.

Cuomo et al., "Method of Making Unstrained Thin Films", *IBM Tech*, vol. 15 No. 9, pp. 2698–2699, Feb. 1973.

Stoemenos et al, "Crystallization . . . Utilizing Gold", *App Phys Lttr*, 18 Mar. 1991.

*Primary Examiner*—Stephen D. Meier
*Attorney, Agent, or Firm*—Sixbey, Friedman, Leedom & Ferguson; Gerald J. Ferguson, Jr.; Karlton C. Butts

[57] ABSTRACT

A highly reliable thin-film transistor (TFT) having excellent characteristics. A silicon film is grown laterally by adding a metal element such as nickel to promote crystallization. A crystal grain boundary is formed parallel to a gate electrode and around the center of the gate electrode. Thus, the grain boundary does not exist around the interface between the drain and the channel formation region. At this interface, a large stress is induced by a large electric field. The concentration of the metal element is low around the interface between the drain and the channel formation region. Therefore, the leakage voltage is small. Also, when a reverse voltage is applied to the gate electrode, the leakage current is small.

13 Claims, 4 Drawing Sheets

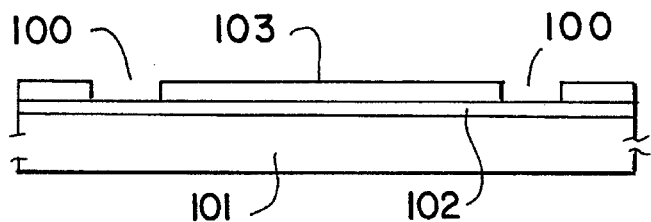
FIG.IA
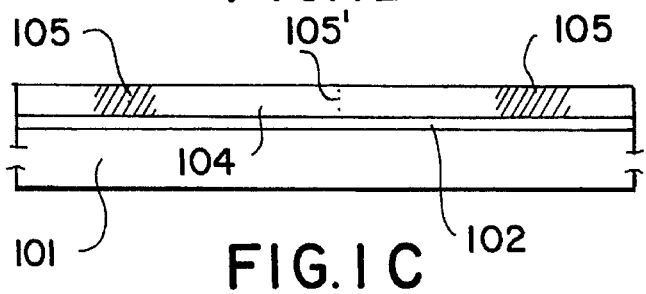
FIG.IB
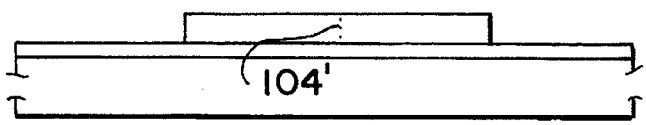
FIG.IC
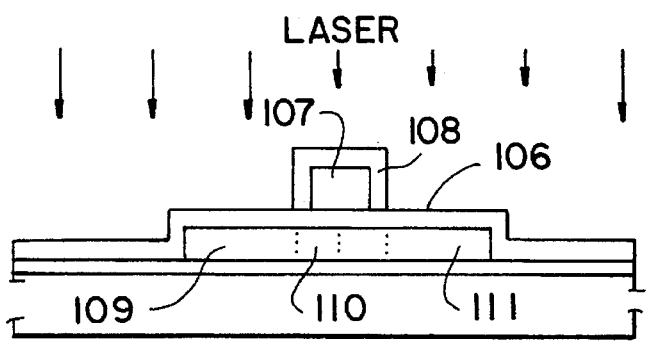
FIG.ID
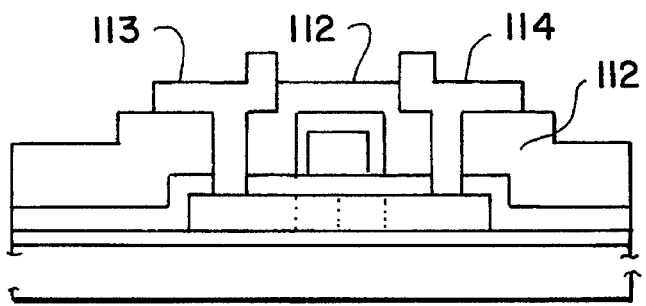
FIG.IE a: Present Invention
b: Prior Art

SEMICONDUCTOR DEVICE AND METHOD OF FABRICATING SAME

FIELD OF THE INVENTION

The present invention relates to an insulated gate field effect transistor, especially, to a thin film type IGFET, having a silicon film formed on an insulating substrate made of glass or on an insulating coating formed on various substrates. TFTs according to the invention are used in an active-matrix liquid crystal display and in other electronic circuits.

BACKGROUND OF THE INVENTION

In recent years, semiconductor devices having TFTs on an insulating substrate made of glass or the like, such as active-matrix liquid crystal displays using TFTs for driving pixels and image sensors, have been developed.

Generally, TFTs used in these devices are made of a silicon semiconductor in the form of a thin film. Silicon semiconductors in the form of a thin film are roughly classified into amorphous silicon semiconductors (a-Si) and crystalline silicon semiconductors. Amorphous silicon semiconductors are fabricated at relatively low temperatures. In addition, they are relatively easy to manufacture by chemical vapor deposition. Furthermore, they can be easily mass-produced. Therefore, amorphous silicon semiconductors have enjoyed the widest acceptance. However, their physical properties such as conductivity are inferior to those of crystalline silicon semiconductors. In order to obtain higher-speed characteristics from amorphous silicon semiconductors, a method of fabricating TFTs having a crystalline silicon semiconductor must be established and has been keenly sought for.

A known method of obtaining a crystalline silicon semiconductor in the form of a thin film comprises forming an amorphous silicon film and thermally annealing it for a long time so as to crystallize the film. However, this method requires a high annealing temperature exceeding 600° C. Therefore, it is difficult to use a cheap glass substrate. Furthermore, the throughput is low because the annealing time is as long as tens of hours.

A phenomenon capable of solving these problems has been found and disclosed in U.S. application Ser. No. 08/160,908 filed Dec. 3, 1993. In particular, if some kind of metal element is added to a silicon film, the metal element acts as a catalyst, so that crystallization progresses at a lower temperature and more quickly. Such metal elements, or catalytic elements, for promoting crystallization include elements belonging to group VIII of the periodic table, i.e., Fe, Co, Ni, Ru, Rh, Pd, Os, Ir, and Pt, transition elements, i.e., Sc, Ti, V, Cr, Mn, Cu, and Zn. Also, Au and Ag can be used as catalytic elements. Among others, Ni produces especially conspicuous effects.

An example of method of fabricating a TFT, using such a metal element is described now by referring to FIGS. 3(A)–3(D). Corning 7059 glass or other non-alkaline borosilicate glass is used as a substrate 301. Usually, a silicon oxide film having a thickness of 500 to 5000 Å, e.g. 2000 Å, is formed as an underlying film 302 on the substrate. An amorphous silicon film 303 having a thickness of 200 to 5000 Å, e.g., 800 Å, is deposited on the underlying film by plasma-assisted CVD (PCVD), low-pressure CVD (LPCVD), or other method.

Then, a very thin film 304 having a catalytic element is uniformly formed by sputtering or other method. Since the thickness of the film containing this catalytic element determines the concentration of the catalytic element contained in the silicon film, the thickness is usually as thin as 5 to 100 Å. Where the film is extremely thin, it does not take the form of a film (FIG. 3(A)).

Then, a protective film 306 is formed of silicon oxide or the like, and an annealing step is carried out. The thickness of the protective film is 100 to 1000 Å, e.g., 300 Å. The annealing temperature is 450° to 600° C., e.g., 550° C. The annealing time is 1 to 10 hours, e.g., 4 hours. The amorphous silicon film is crystallized by this annealing step. The crystallized silicon film is patterned to form a silicon film region 305 in the form of an island. This island is used as an active layer of a TFT (FIG. 3(B)).

Thereafter, a gate-insulating film 307 and a gate electrode 308 are formed. Using them as a mask, an impurity is implanted by a known self-aligning process to form a source 309 and a drain 310. To activate the impurity, laser irradiation or thermal annealing is utilized as shown in FIG. 3(C).

Then, an interlayer insulator 311 is formed and contact holes are formed therethrough. Electrodes 312 and 313 are formed for the source and drain. Thus, a TFT is completed (FIG. 3(D)).

In the TFT formed in this way, a catalytic element is uniformly dispersed in the active layer to form energy levels in the semiconductor. Therefore, a leakage current tends to occur at the interface between the drain (source) and channel formation region where an especially high electric field is generated at this interface. That is, where a reverse voltage (i.e., a negative voltage for an N-channel TFT and a positive voltage for a P-channel TFT) is applied to the gate electrode, as the absolute value of the applied voltage is increased, the leakage current between the source and drain increases. Additionally, the threshold voltage of the TFT is increased.

SUMMARY OF THE INVENTION

It is an object of the present invention to provide means for solving the foregoing problems.

The above object is achieved in accordance with the teachings of the invention by selectively lowering the concentration of a catalytic element at the interface between the drain and channel formation region at which an especially high electric field is produced.

In one feature of the invention, a catalytic element is selectively introduced in a silicon film, rather than adding a catalytic element uniformly. Therefore, crystallization starts from the initially introduced portions and proceeds to the surroundings. The inventor has found that the concentration of the catalytic element at the front ends of the growing crystals is higher than the concentration in finished crystal portions by about one order of magnitude. A crystal grain boundary is produced at a portion at which two growing crystals starting from different portions meet. The crystals stop growing there. Thus, a concentration of the catalytic element in the grain boundary is highest.

Since the concentration of the catalytic element in the grain boundary formed in this way is high, an arrangement where the grain boundary is located at the interface between the drain and the channel formation region should be avoided. In contrast, if the grain boundary is kept in the center of the channel formation region, then the grain boundary does not exist at the interface between the drain and the channel formation region. Consequently, the concentration of the catalytic element at this portion is extremely low. As a result, the leakage current occurring when a reverse voltage is applied to the gate electrode is reduced, and the threshold voltage is decreased.

Accordingly, in the present invention, a catalytic element is selectively introduced into a silicon film from at least two locations to induce crystallization. At the same time, a grain boundary is intentionally created. A gate electrode is formed over this grain boundary. If the grain boundary is linear, the gate electrode can be appropriately formed. If source and drain are formed by a self-aligning process, using the gate electrode as a mask, then the grain boundary is located substantially in the center of the channel formation region.

The method of introducing the catalytic element comprises coating an amorphous silicon film with a masking material and selectively forming introduction locations in this masking material as in Example 1 of the invention. Also, another method comprises forming a silicon region in the form of an island, exposing only the side surfaces, and forming a coating containing the catalytic element over the exposed surfaces, as in Example 2.

In the present invention, the grain boundary at which the concentration of the catalytic element is high is located around the center of the channel formation region. The concentration of the catalytic element at the interface between the drain and the channel formation region is inevitably made low. Therefore, if a reverse voltage is applied to the gate electrode, the leakage current is small, and the threshold voltage is low. This enhances the ON/OFF ratio of the TFT. Where TFTs of this structure are used in an active-matrix liquid crystal display, electric charge can be held well. The low threshold voltage means that the TFTs can be effectively driven by an electric current if the gate voltage is low, which, in turn, means that the ON/OFF ratio is high.

Other objects and features of the invention will appear in the course of the description thereof, which follows.

BRIEF DESCRIPTION OF THE DRAWINGS

FIGS. 1(A)–i(E) are a cross-sectional view of a TFT, illustrating successive steps for fabricating the TFT according to Example 1 of the invention.

DETAILED DESCRIPTION OF THE INVENTION

Figure 2A:
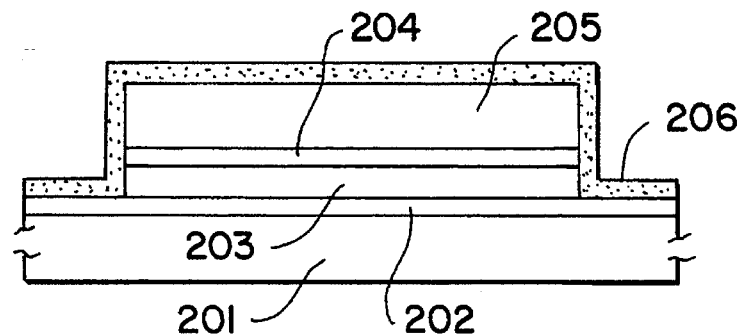
FIGS. 2(A)–2(D) are a cross-sectional view of a TFT, illustrating successive steps for fabricating the TFT according to Example 2 of the invention.
Figure 2B:
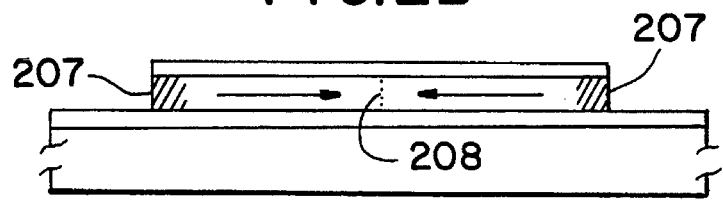
Figure 2C:
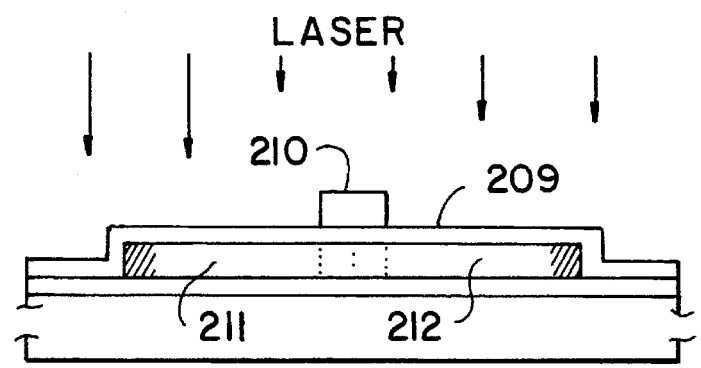
Figure 2D:
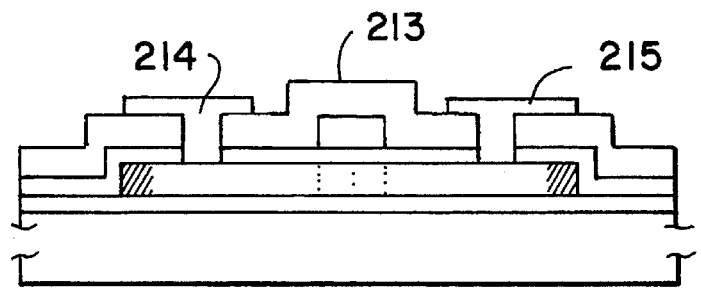
Figure 3A:
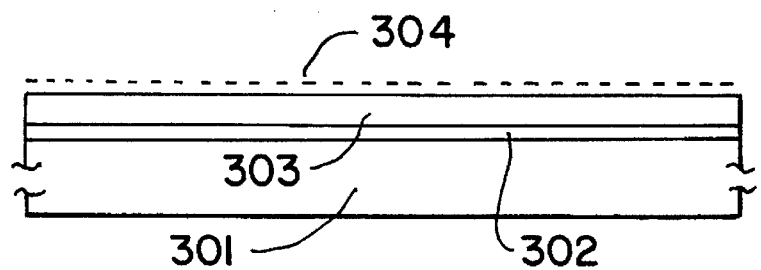
FIGS. 3(A)–3(D) are a cross-sectional view of a TFT, illustrating successive steps for fabricating the TFT by the prior art techniques.
Figure 3B:
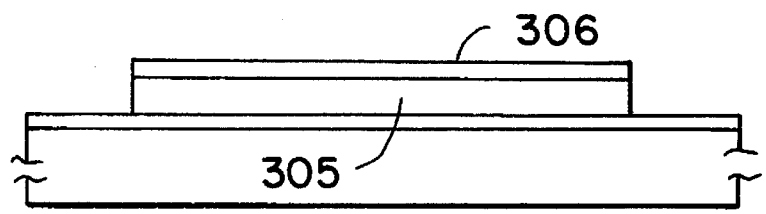
Figure 3C:
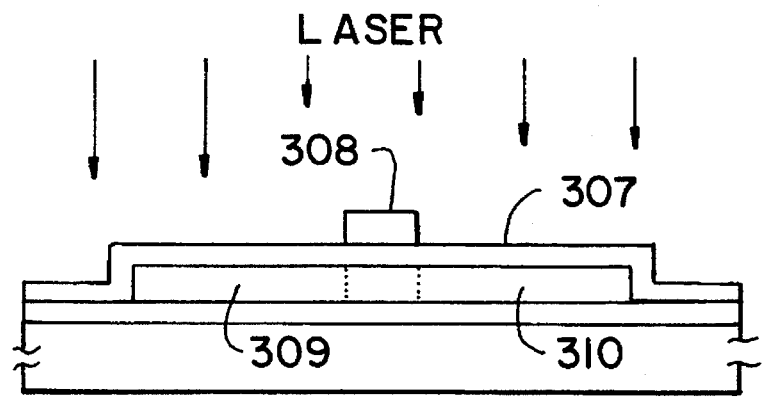
Figure 3D:
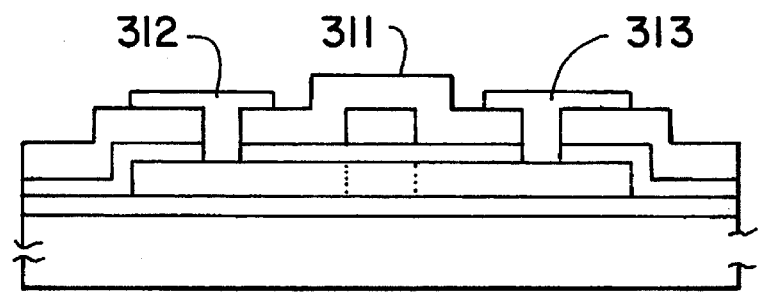

FIGS. 1(A)–i(D) are a cross-sectional view of a TFT, illustrating the process sequence of the present example. First, silicon oxide was sputtered as an underlying film 102 having a thickness of 2000 Å on a substrate 101 smade of Corning 7059 glass. The substrate was annealed above its strain point either before or after formation of the underlying film. If the laminate is then slowly cooled below the strain point at a rate of 0.1° to 1.0° C./min, the substrate would shrink to a lesser extent in later steps involving temperature elevation. This makes it easy to perform a mask alignment. Where the substrate was made of Corning 7059 glass, it was annealed at 620°–660° C. for 1 to 4 hours. Subsequently, the substrate was slowly cooled at a rate of 0.1° to 1.0° C./min, preferably 0.1° to 0.3° C./min. When the temperature dropped to 450–590° C., the substrate was taken out.

After the formation of the underlying film, a mask 103 was formed of silicon nitride or other material. This mask 103 was provided with holes or slits 100 so that the underlying film 102 was exposed through the slits. More specifically, when the state shown in FIG. 1(A) is viewed from above, the underlying film 102 was exposed through the slits; the other portions were masked. After forming the mask 103, a metallic nickel film having a thickness of 5 to 200 Å, e.g., 20 Å, was formed over the whole surface by sputtering. Instead of the metallic nickel film, a nickel silicide film given by a chemical formula $NiSi_x$, where $0 \leq x \leq 4$ (e.g., x=2.0), may be used. Under this condition, nickel was selectively introduced into the regions 100 (FIG. 1 (A)).

Then, only the mask 103 was removed. An intrinsic (I-type) amorphous silicon film having a thickness of 300 to 1500 Å, e.g., 500 Å, was formed by plasma-assisted CVD (PCVD). The amorphous film was annealed at 550° C. for 4 to 8 hours in an inactive atmosphere (consisting of nitrogen or argon) at 1 atm to crystallize the amorphous film. The nickel film was selectively left on the regions 105 overlying the regions 100. These regions 105 were quite heavily doped with nickel. Crystallization progressed laterally from these regions 105. The crystalline regions 104 were comparatively lightly doped with nickel. Crystals grown from two regions met each other, thus forming a crystal grain boundary 105' at which the nickel concentration was high. This grain boundary was perpendicular to the plane of the sheet of the drawing. Accordingly, the grain boundary was linear like the gate electrode (FIG. 1(B)).

After this step, the silicon film was patterned to form the active layer 104' of a TFT in the form of an island. The size of the active layer 104' is determined, taking account of the channel length and the channel width of the TFT. A smaller active layer measured 50 μm×20 μm. A larger active layer measured 100 μm×1000 μm (FIG. I(C)).

Then, a silicon oxide film 106 having a thickness of 1000 Åwas formed using TEOS (tetraethoxysilane ($Si(OC_2H_5)_4$)) and oxygen by PCVD as a gate-insulating film. During the formation of this film, the substrate temperature was 300° to 550° C., e.g., 400° C.

Subsequently, an aluminum film having a thickness of 6000 to 8000 Å, e.g., 6000 Å, and containing 0.01 to 0.2% scandium was formed by sputtering. The aluminum film was then patterned to form a gate electrode 107. The patterning step was so carried out that the gate electrode was located just above the grain boundary 105'. The surface of the aluminum electrode was anodized to form an oxide layer 108 on the surface. This anodization was effected in an ethylene glycol solution containing 1 to 5% tartaric acid. The thickness of the obtained oxide layer 108 was 2000 Å. Since the thickness of this oxide 108 determines an offset gate region in a later ion doping step, the length of the offset gate region can be determined in the anodization step described above.

Then, using the gate electrode portion comprising the gate electrode 107 and the surrounding oxide layer 108 as a mask, an impurity for imparting conductivity type P or N by a self-aligning process was implanted into the active layer 104' by ion doping (also called as plasma doping). Phosphine ($PH_3$) or diborane ($B_2H_6$) were used as dopant gases. Where the phosphine was used, the accelerating voltage was 60 to 90 kV, e.g., 80 kV. Where diborane was used, the accelerating voltage was 40 to 80 kV, e.g., 65 kV. The dose was $1\times10^{15}$ to $8\times10^{15}/cm^2$. For example, phosphorus was implanted at a dose of $2\times10^{15}/cm^2$. As a result, N-type doped regions 109 and 111 were formed. A channel formation region 110 was left between these two doped regions. A grain boundary 105' existed around the center of the channel formation region 110.

Thereafter, the implanted impurity was activated by irradiation of laser light. The laser light was emitted by a KrF excimer laser (having a wavelength of 248 nm and a pulse width of 20 nsec). Other laser may also be used. The laser light was emitted at an energy density of 200 to 400 mJ/cm², e.g., 250 mJ/cm². Two to 10 shots, e.g., 2 shots, were emitted per location. The effect may be enhanced by heating the substrate to about 200° to 450° C. during the laser irradiation (FIG. 1(D)).

This step may also be carried out, using lamp annealing making use of visible or near-infrared radiation. Visible and near-infrared radiation can be readily absorbed by crystallized silicon and amorphous silicon doped with phosphorus or boron at a concentration of $10^{19}$ to $10^{21}$ cm$^{-3}$ and permits an effective anneal comparable to thermal annealing conducted above 1000° C. If phosphorus or boron is added, the impurity scatters light and so even near-infrared radiation is sufficiently absorbed. On the other hand, near-infrared radiation is not readily absorbed by a glass substrate and, therefore, the glass substrate is prevented from being overheated. Also, the processing can be completed in a short time. Hence, it can be said that this processing is the best method for a step in which shrinkage of the glass substrate is a problem.

Subsequently, a silicon oxide film 112 having a thickness of 6000 Å was formed as an interlayer insulator by PCVD. This interlayer insulator may also be made of either polyimide or a multilayer of silicon oxide and polyimide. Then, contact holes were formed. Electrodes and interconnects, 113 and 114, of a TFT were formed of a metal material such as a multilayer of titanium nitride and aluminum. Finally, the laminate was annealed at 350° C. for 30 minutes in a hydrogen ambient at 1 atm to complete a TFT (FIG. l(E)).

The circuit described above comprises only one TFT (an N-channel TFT). A CMOS structure consisting of a combination of dissimilar TFTs, e.g., comprising complementary PTFT and NTFT, may also be formed.

In the present example, the method of introducing nickel comprises forming a thin nickel film selectively on the underlying film 102 under the amorphous silicon film and growing crystals from these portions. Alternatively, the nickel film may be formed selectively after formation of the amorphous silicon film. That is, the crystals may be grown either from the top surface or from the underlying surface of the amorphous silicon film. In a further method, an amorphous silicon film is previously formed, and nickel ions are selectively implanted into the amorphous silicon film 104 by ion doping. In this case, the concentration of the nickel can be controlled accurately. Plasma processing and CVD may also be employed.

Figure 4:
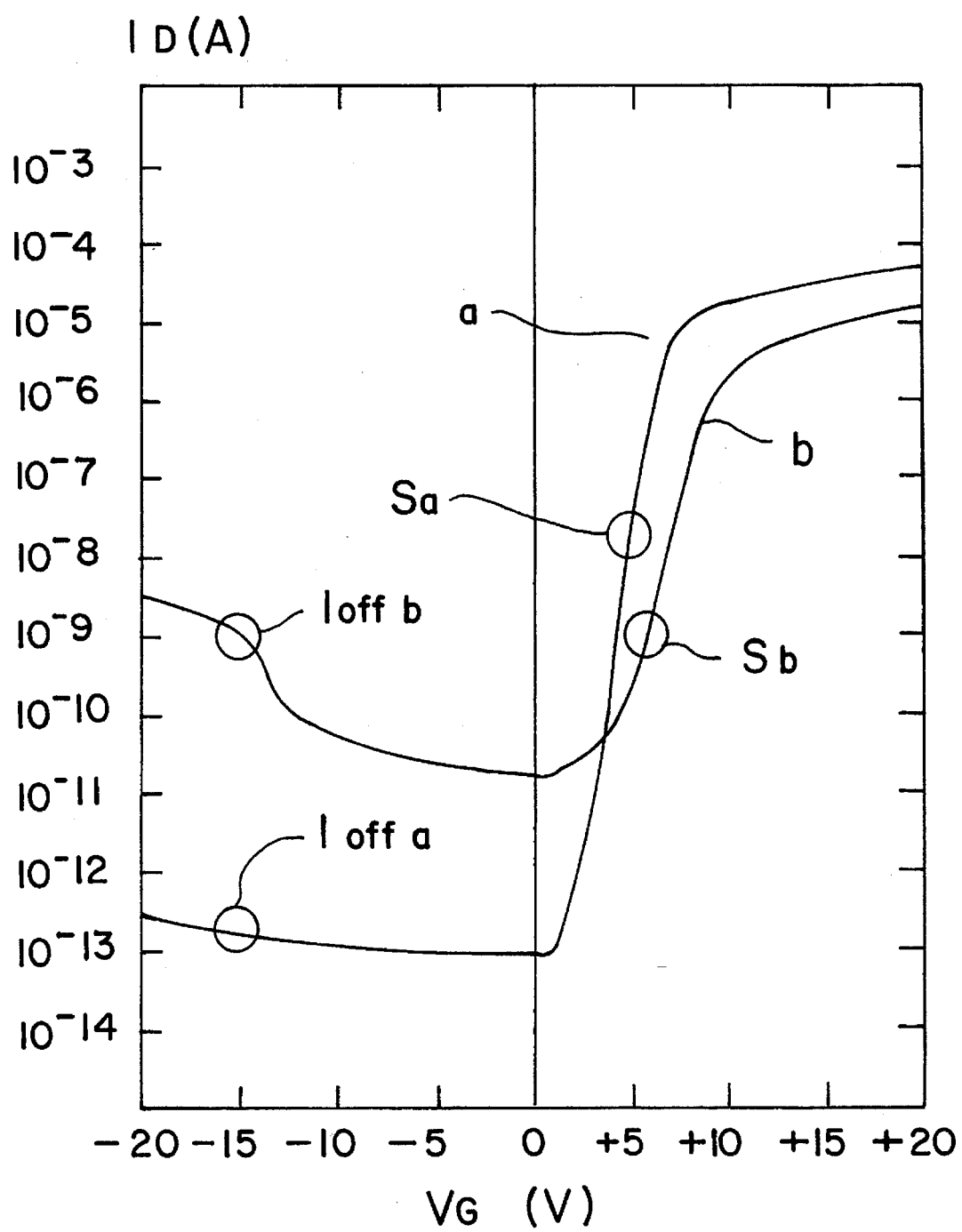
FIG. 4 is a graph showing the $I_D$-$V_G$ characteristics of a TFT fabricated in Example 1, as well as the $I_D$—$V_G$ characteristics of a TFT fabricated by the prior art method.

FIG. 4 shows the $V_G$-$I_D$ characteristic (curve a) of the TFT obtained in the present example and the $V_G$-$I_D$ characteristic (curve b) of a TFT fabricated by a prior art method. During the measurement, the source-drain voltage was 1 V. It can be seen from curve a that when a negative voltage is applied to the gate, the leakage current $I_{offa}$ is small, and when a positive voltage is impressed, the rising portion ($S_a$) is steep. The ON/OFF ratio is 9 orders of magnitude. Hence, the TFT acts as an ideal field-effect transistor. It can be seen from curve b that the TFT acts also as a field-effect transistor. However, the leakage current $I_{OFFb}$ is larger than the former leakage current. When a positive voltage is applied, the rising portion ($S_b$) is mild. The ON/OFF ratio is about 6 orders of magnitude. The threshold voltage of the former TFT is smaller than the threshold voltage of the latter TFT. In this way, the invention can improve the characteristics of TFTs.

EXAMPLE 2

The process sequence of the present example is schematically shown in FIGS. 2(A)–2(D). In the present example, a Corning 7059 substrate having a thickness of 1.1 mm and measuring 300 mm by 400 mm was used as a substrate 201. The substrate was annealed at 640° C. for 4 hours in the same way as in Example 1. Then, the substrate was slowly cooled down to 550° C. at a rate of 0.2° C./min. An underlying film 202 of silicon oxide was formed to a thickness of 2000 Å by PCVD using TEOS and oxygen as a starting material. After the formation of the underlying film, the laminate was again annealed at 550° C. for 1 hour.

Then, an amorphous silicon film was deposited to a thickness of 500 Å by LPCVD or PCVD. Also, a silicon oxide film having a thickness of 200 Å was formed by LPCVD. A photoresist or photosensitive polyimide was applied to the top surface of the silicon oxide film. This photoresist or polyimide was exposed by a well-known photolithographic method. Using the left photoresist or other masking material 205, the silicon oxide film and the amorphous silicon film were etched by wet etching or dry etching to form a silicon film 203 in the form of an island and a silicon oxide film 204 which was in intimate contact with the top surface of the silicon oxide film 203. Then, a nickel film 206 having a thickness of 100 to 1000 Å, e.g., 500 Å, was formed by sputtering (FIG. 2(A)).

Then, a dehydrogenation step was carried out at 450° C. for 1 hour, and the laminate was thermally annealed to crystallize the amorphous film. The annealing step was carried out at 550° C. for 8 hours. During this annealing step, the side surfaces of the amorphous silicon film 203 were in contact with the nickel film, the concentration of nickel in these portions 207 was quite high. Crystallization started from these portions 207 as indicated by the arrows 207. Since the crystallization progressed from the side surfaces of the silicon film in the form of an island, crystals met each other around the center, thus forming a crystal grain boundary 208. This grain boundary was perpendicular to the plane of the sheet. When viewed from above, the grain boundary was linear in the same way as the gate electrode (FIG. 2(B)).

After the crystallization step, the silicon oxide film 204 was removed. A gate-insulating film 209 having a thickness of 70 to 120 nm, typically 120 nm, was again formed by PCVD over the whole surface using TEOS and oxygen. The substrate temperature was 350° C. Then, a film made of polysilicon was formed by CVD and patterned to form a gate electrode 210. This patterning step was so effected that the gate electrode existed just over the grain boundary 208. In order to improve the conductivity, 0.1 to 5% phosphorus was added to the polysilicon of the gate electrode.

Subsequently, phosphorus was implanted as an N-type impurity by ion doping. A source region 211 and a drain region 212 were formed by a self-aligning process. The laminate was then irradiated with laser light emitted by a KrF laser to improve the crystallinity of the silicon film whose crystallinity was deteriorated by the ion implantation.

At this time, the energy density of the laser light was 250 to 300 mJ/cm². As a result of this laser irradiation, the source/drain regions of the TFT had a sheet resistance of 300 to 800 Ω/cm². This step may also be carried out by lamp annealing using a lamp emitting visible light or near-infrared light. In this way, an active layer in which the grain boundary was located around the center of the channel formation region was obtained (FIG. 2(C)).

Thereafter, an interlayer insulator 213 made of silicon oxide or polyimide was formed. Then, contact holes were formed. Electrodes 214 and 215 comprising a multilayer film of chromium and aluminum were formed in the source/drain regions of the TFT. Finally, the laminate was annealed at 200°–400° C. for 2 hours within hydrogen to conduct hydrogenation. In this manner, the TFT was completed. In order to improve the moisture resistance, a passivation film may be formed out of silicon nitride over the whole surface (FIG. 2(D)).

It has been found experimentally that a concentration of the crystallization promoting metal element such as nickel is preferably not higher than $4\times10^{18}$ atoms/cm³ (more preferably $5\times10^{18}$ atoms/cm³) in the region near the source/channel and the drain/channel boundaries.

In the present invention, as can be seen from the above examples, a crystal grain boundary at which the concentration of a metal element, or a catalytic element, for promoting crystallization of an amorphous silicon is high is located around the center of the channel formation region and, therefore, the concentration of the catalytic element at the interface between the drain and the channel formation region is kept low. At this interface, the strength of electric field is greatest. Therefore, when a reverse voltage is applied to the gate electrode, the leakage current between the source and the drain is small. Also, the threshold voltage is low. In addition, after the TFT is used over a long term, the characteristics are deteriorated only a little. The novel TFT has an especially large ON/OFF ratio and so it is adapted to hold electric charge as in an active-matrix display.

In the above examples, nickel is used as a catalytic element. Obviously, other metal elements listed above can be used instead.

What is claimed is:

1. A thin-film transistor comprising:
    a crystalline silicon film shaped like an island having a top surface and a bottom surface, said silicon film containing a metal element for promoting crystallization, said silicon film having a channel formation region, a source region, and a drain region wherein boundaries are defined between said source region and said channel region, and between said drain region and said channel region;
    a gate-insulating film for covering at least a part of said crystalline silicon film;
    a crystal grain boundary formed in said channel formation region and extending perpendicularly to flow of carriers, said grain boundary containing said metal element for promoting said crystallization at a high concentration, said grain boundary extending from said top surface to said bottom surface in said channel forming region and located apart from the boundary between said source region and said channel region, and the boundary between said drain region and said channel region; and
    a gate electrode formed on said gate-insulating film which is substantially coincident in shape with said channel formation region.

2. A thin-film transistor of claim 1, wherein said crystal grain boundary is located around a center of said channel formation region.

3. The thin film transistor of claim 1 wherein the crystals constituting said channel region substantially perpendicularly extend toward said crystal grain boundary from opposite sides thereof whereby said crystal grain boundary defines the boundary between the crystals on the opposite sides thereof.

4. The thin film transistor of claim 1 wherein said channel region is located on both sides of said grain boundary.

5. An insulated gate field effect transistor comprising:
    a semiconductor layer formed on an insulating surface, said semiconductor layer including source, drain and channel regions formed therein; and
    a gate electrode provided adjacent to said channel region with a gate insulating interposed therebetween,
    wherein said semiconductor layer contains a crystallization promoting metal element, and a concentration of said metal element at a source and channel boundary and a drain and channel boundary is lower than a concentration of said metal element in a middle portion of said channel region.

6. The insulated gate field effect transistor of claim 5 wherein said semiconductor layer comprises silicon.

7. The insulated gate field effect transistor of claim 5 wherein said concentration at the source and channel boundary and a drain and channel boundary is not higher than $4\times10^{18}$ atoms/cm³.

8. The transistor of claim 5 wherein said metal element is selected from the group consisting of Fe, Co, Ni, Ru, Rh, Pd, Os, Ir, Pt, Sc, Ti, V, Cr, Mn, Cu, Zn, Au and Ag.

9. The transistor of claim 5 wherein said semiconductor layer comprises a crystalline silicon.

10. A thin film transistor which has a crystalline semiconductor layer, said semiconductor layer comprising:
    source and drain regions; and
    a channel region extending in a first direction between said source and drain regions and having a top surface and a bottom surface and boundaries defined between said source region and said channel region, and between said drain region and said channel region,
    wherein said channel region has a grain boundary extending from said top surface to said bottom surface in said channel region and located apart from both said boundaries between said channel region and said source and drain regions, said grain boundary extending across said channel region in a second direction substantially perpendicular to said first direction.

11. The thin film transistor of claim 10 wherein at least said channel region contains a metal element selected from the group consisting of Fe, Co, Ni, Ru, Rh, Pd, Os, Ir, Pt, Sc, Ti, V, Cr, Mn, Cu, Zn, Au and Ag.

12. The thin film transistor of claim 11 wherein a concentration of said metal in the vicinity of said boundaries between said channel region and said source and drain regions is not higher than $4\times10^{18}$ atoms/cm³.

13. The thin film transistor of claim 10 wherein said source and drain regions have one of p-type or n-type conductivity.

* * * * *